US008847817B2

(12) United States Patent
Utagawa et al.

(10) Patent No.: US 8,847,817 B2
(45) Date of Patent: *Sep. 30, 2014

(54) PULSE SIGNAL GENERATION DEVICE

(75) Inventors: Hitoshi Utagawa, Koganei (JP); Toshiaki Matsui, Koganei (JP)

(73) Assignees: National Institute of Information and Communication Technology, Koganei-shi (JP); Communications Research Laboratory, Inc., Kohanei-shi (JP)

( * ) Notice: Subject to any disclaimer, the term of this patent is extended or adjusted under 35 U.S.C. 154(b) by 804 days.

This patent is subject to a terminal disclaimer.

(21) Appl. No.: 13/123,135
(22) PCT Filed: Oct. 6, 2009
(86) PCT No.: PCT/JP2009/067682
§ 371 (c)(1), (2), (4) Date: Aug. 24, 2011
(87) PCT Pub. No.: WO2010/041752
PCT Pub. Date: Apr. 15, 2010

(65) Prior Publication Data

US 2012/0002388 A1 Jan. 5, 2012

(30) Foreign Application Priority Data

Oct. 7, 2008 (JP) ................................. 2008-260816

(51) Int. Cl.

| | |
|---|---|
| ***G01S 13/00*** | (2006.01) |
| ***H03B 7/14*** | (2006.01) |
| ***H01Q 23/00*** | (2006.01) |
| ***H01Q 19/30*** | (2006.01) |
| ***H01Q 13/00*** | (2006.01) |
| ***H01Q 9/28*** | (2006.01) |
| ***H01Q 5/00*** | (2006.01) |
| ***H01Q 19/10*** | (2006.01) |
| ***H01Q 15/00*** | (2006.01) |

(52) U.S. Cl.
CPC ............... *H01Q 9/285* (2013.01); *H01Q 23/00* (2013.01); *H01Q 19/30* (2013.01); *H01Q 13/00* (2013.01); *H01Q 5/0017* (2013.01); *H01Q 19/10* (2013.01); *H01Q 15/0086* (2013.01)
USPC ...................... 342/175; 342/202; 331/107 DP

(58) Field of Classification Search
USPC ......... 342/22, 70–72, 92, 104, 114, 115, 175; 331/107 DP
See application file for complete search history.

(56) References Cited

U.S. PATENT DOCUMENTS 3,626,327 A * 12/1971 Luchsinger et al. .... 331/107 DP
3,702,977 A * 11/1972 Olsson .................... 331/107 DP (Continued)

FOREIGN PATENT DOCUMENTS

JP 8-511341 A 11/1996
JP 10-511182 A 10/1998

(Continued)

OTHER PUBLICATIONS

Choi, Y.H., "Gated UWB Pulse Signal Generation," IEEE, pp. 122-124, (2004).

(Continued)

*Primary Examiner* — Peter Bythrow
(74) *Attorney, Agent, or Firm* — Oblon, Spivak, McClelland, Maier & Neustadt, L.L.P.

(57) ABSTRACT

To provide a microwave/milliwave band high-frequency pulse signal generating device that enables realization of structural simplification, high performance, compact integration, easy design, low power consumption, and low cost. A radiation type oscillator substrate S1 having an inner-layer GND 12 interposed between a front-side dielectric substrate 10 and a rear-side dielectric substrate 11 is provided on the radiation surface side with a pair of axially symmetrical patches 4, 4, a gate electrode 2 and drain electrode 3 of a microwave transistor 1 are respectively connected to the conductor patches 4, 4, DC bias is supplied to the gate electrode 2 through an RF choke circuit 5*a*, a monopulse from a monopulse generation circuit 7 is supplied to the drain electrode 3 through an RF choke circuit 5*b*, an impedance line 9 satisfying an oscillating condition is connected to a source electrode 8, and a high-frequency pulse signal of an oscillation frequency/frequency bandwidth determined by negative resistance produced by short-duration operation of the microwave transistor 1 and the resonant cavity structure is generated and simultaneously radiated into space.

8 Claims, 19 Drawing Sheets

(56) References Cited

U.S. PATENT DOCUMENTS

| | | | | |
|---|---|---|---|---|
| 3,796,969 | A * | 3/1974 | Bosch et al. | 332/130 |
| 3,878,480 | A * | 4/1975 | Hulderman et al. | 331/96 |
| 4,745,374 | A * | 5/1988 | Nishizawa et al. | 331/96 |
| 4,768,079 | A * | 8/1988 | Kandpal et al. | 257/664 |
| 4,885,589 | A * | 12/1989 | Edward et al. | 342/175 |
| 5,483,206 | A * | 1/1996 | Lohninger | 331/107 SL |
| 5,982,245 | A * | 11/1999 | Matsui et al. | 331/99 |
| 6,246,295 | B1 * | 6/2001 | Matsui et al. | 331/99 |
| 6,545,553 | B1 * | 4/2003 | Bird et al. | 331/96 |
| 6,828,867 | B2 * | 12/2004 | Ishikawa et al. | 331/107 DP |
| 7,049,897 | B2 * | 5/2006 | Haruta | 331/96 |
| 8,212,718 | B2 * | 7/2012 | Utagawa et al. | 342/195 |
| 2004/0036543 | A1 * | 2/2004 | Iio | 331/107 DP |
| 2005/0088336 | A1 * | 4/2005 | Sakamoto et al. | 342/175 |
| 2005/0156780 | A1 * | 7/2005 | Bonthron et al. | 342/107 |
| 2005/0190101 | A1 * | 9/2005 | Hiramatsu et al. | 342/175 |
| 2006/0017606 | A1 * | 1/2006 | Hayata et al. | 342/41 |
| 2008/0048792 | A1 * | 2/2008 | Ouchi et al. | 331/107 T |
| 2008/0091380 | A1 * | 4/2008 | Nagasaku et al. | 702/142 |
| 2009/0201106 | A1 * | 8/2009 | Iio et al. | 333/208 |
| 2010/0117891 | A1 * | 5/2010 | Utagawa et al. | 342/175 |
| 2010/0315990 | A1 | 12/2010 | Utagawa et al. | |

FOREIGN PATENT DOCUMENTS

| | | | |
|---|---|---|---|
| JP | 11-31918 | A | 2/1999 |
| JP | 2000 261234 | | 9/2000 |
| JP | 2001-251138 | A | 9/2001 |
| JP | 2003 515974 | | 5/2003 |
| JP | 2004-72589 | A | 3/2004 |
| JP | 2004 186726 | | 7/2004 |
| JP | 2006-504963 | A | 2/2006 |
| JP | 2006-74679 | A | 3/2006 |
| JP | 2006-112915 | A | 4/2006 |
| JP | 2007 124628 | | 5/2007 |
| JP | 2007-174244 | A | 7/2007 |
| JP | 2007-221369 | A | 8/2007 |
| JP | 2007-318469 | A | 12/2007 |
| JP | 2008-61239 | A | 3/2008 |

OTHER PUBLICATIONS

Gresham, I., et al., "Ultra-Wideband Radar Sensors for Short-Range Vehicular Applications," IEEE Transactions on Microwave Theory and Techniques, vol. 52, No. 9, pp. 2105-2122, (Sep. 2004).

International Search Report issued Dec. 28, 2009 in PCT/JP09/067682 filed Oct. 6, 2009.

U.S. Appl. No. 13/121,063, filed Jun. 13, 2011, Utagawa, et al.

U.S. Appl. No. 13/123,338, filed Jul. 5, 2011, Utagawa, et al.

U.S. Appl. No. 13/123,115, filed Jul. 12, 2011, Utagawa, et al.

Office Action issued Jul. 30, 2013 in Japanese Patent Application No. 2008-260816.

* cited by examiner

PULSE SIGNAL GENERATION DEVICE

TECHNICAL FIELD

This invention relates to a high-frequency signal generating device for generating an ultra-wideband (UWB) high-frequency pulse signal, particularly to a technology for realizing structure simplification, low cost, and high performance in a microwave/milliwave band device incompatible with a complicated circuit configuration.

BACKGROUND ART

UWB technologies have attracted attention as communication technologies in recent years. Although these technologies use extremely broad frequency bands, they are extremely low in power spectral density and therefore have the advantage of being able to share frequencies already in use. Moreover, they have advantages such as that by using short pulses of several hundred picoseconds or shorter, they make it possible to perform high-resolution position detection and the like.

In conventional microwave/milliwave band UWB technology, a high-frequency pulse signal generating device is configured with the high-frequency pulse signal generator and an ultra-wideband antenna connected by a transmission line (see, for example, Non-patent Document 1, Non-patent Document 2, and Patent Document 1).

[Non-patent Document 1] Yun Hwa choi, "Gated UWB Pulse Signal. Generation," Joint with Conference on Ultra wideband. Systems and Technologies Joint UWBST & IWUWBS. 2004 International Workshop on, pp. 122-124.

[Non-patent Document 2] Ian Gresham, "Ultra-Wideband Radar Sensors for Short-Range Vehicular Applications", MTT VOL. 52, No. 9, pp. 2111-2113, September 2004

[Patent Document 1] Published Japanese Translation 2003-515974 of PCT Application The high-frequency pulse signal generators described in Non-patent Document 1, Non-patent Document 2 and Patent Document 1 are configured by the method of using an ultra-wideband filter circuit to pass only a certain part of the frequency components of a base band signal (monopulse signal or step signal generated in accordance with the base band signal), by the method of modulating the output of a CW signal oscillator such as by passing/blocking it in a high-speed RF switch, or by a combination thereof.

On the other hand, there has also been proposed a high-frequency pulse signal generating device in which the transmission line or resonant circuit is replaced by an antenna. (see, for example, Patent Document 2 and Patent Document 3).

[Patent Document 2] Unexamined Japanese Patent Publication 2004-186726

[Patent Document 3] Unexamined Japanese Patent Publication 2007-124628

The high-frequency pulse signal generating devices described in Patent Document 2 and Patent Document 3 are of the type that load a charge in an antenna that is the transmission line or resonant circuit and rapidly discharging the charge using a high-speed switch or the like. Among the frequency components generated by the high-speed discharge, the frequency components of the resonant frequency band of the antenna constituting the resonant circuit are radiated.

DISCLOSURE OF THE INVENTION

However, the inventions described in the aforesaid Non-patent Document 1, Non-patent Document 2 and Patent Document 1 are configured with the high-frequency pulse signal generator and ultra-wideband antenna connected by a transmission line, so that in addition to the problem of transmission line transmission loss, the configuration is undesirable for a microwave/milliwave band device incompatible with a complicated circuit configuration.

Further, in the device configurations of the inventions described in the aforesaid Non-patent Document 1, Non-patent Document 2, or Patent Document 1 each of the various circuits in the devices, including the filters, amplifiers and RF switches, are required to exhibit ultra-wideband characteristics. For example, in the case where the pulse generation circuit and filter circuit are connected by transmission lines, much multiple reflection occurs between the individual circuits unless the input/output refection coefficients of the individual circuits and the reflection coefficients of the connections is adequately small across the wideband. In addition, if the group delay characteristics of the individual circuits are not flat across the wideband, distortion will arise in the pulse waveform. Such ultra-wideband circuits are therefore more difficult to design than narrow band circuits, so that a device that requires all of the individual circuits to exhibit ultra-wideband characteristics becomes high in cost.

Moreover, the inventions described in the aforesaid Non-patent Document 1, Non-patent Document 2 or Patent Document 1 are configured to connect the high-frequency pulse signal generators and the ultra-wideband antennas using transmission lines, so that impedance is converted from the impedance of the transmission lines (usually 50Ω) to space impedance, making an ultra-wideband antenna necessary, and multiple reflection will occur at the transmission line connectors if the reflection coefficient of the antenna is not adequately small across the ultra-wideband. While a taper-structure non-resonant type antenna or a multiple-resonant type antenna is used as the antenna with such ultra-wideband characteristics, the tapered portion of the taper-structure non-resonant type antenna is unavoidably large because it must be longer than the wavelength, which is disadvantageous for overall device integration, and use of a multiple-resonant type antenna is undesirable from the viewpoint of group delay characteristics and tends to make the structure complicated.

In addition, the method of modulating the output of a CW signal oscillator by passing/blocking it in a high-speed RF switch as in the invention described in the aforesaid Non-patent Document 1, Non-Patent Document 2 or Patent Document 1 is disadvantageous for application to UWB communication due to the intrinsic presence of undesirable CW signal leakage. It is also disadvantageous from the aspect of power consumption because a CW signal oscillator circuit is in operation.

Further, the circuitry of the inventions described in Patent Document 2 and Patent Document 3 tends to be complicated because switch circuits that operate at extremely high speed are required for generating the high-frequency signal components to be radiated and the switch drivers also require high speed.

The object of the present invention is therefore to provide a microwave/milliwave band high-frequency pulse signal generating device enabling realization of structural simplification, high performance, compact integration, easy design, low power consumption, and low cost.

In order to achieve this object, the pulse signal generating device according to claim 1 is characterized in that a radiation type oscillator is configured to integrate a three-electrode high-frequency amplifying device to generate negative resistance in a resonant cavity and share an antenna function for radiating an electromagnetic wave into space; and the three-electrode high-frequency amplifying device is momentarily operated to establish a short-duration negative resistance and a high-frequency pulse signal of an oscillating frequency/frequency band width determined based on the negative resistance and the structure of the resonant cavity is generated and simultaneously radiated into space.

Further, the invention according to claim 2 is characterized in being configured so that in the pulse signal generating device set out in claim 1, the three electrodes of the three-electrode high-frequency amplifying device of the radiation type oscillator are a controlled current inflow electrode, a controlled current outflow electrode and a control electrode; and a monopulse signal is supplied to the controlled current inflow electrode or the controlled current outflow electrode and the power of the monopulse signal itself is used as source power to establish short-duration negative resistance.

Further, the invention according to claim 3 is characterized in that in the pulse signal generating device set out in claim 1, the three electrodes of the three-electrode high-frequency amplifying device of the radiation type oscillator are a controlled current inflow electrode, a controlled current outflow electrode and a control electrode; and direct current is supplied to the controlled current inflow electrode or the controlled current outflow electrode and a monopulse signal is supplied to the control electrode to cause short-duration controlled current to flow and establish short-duration negative resistance.

Further, the invention according to claim 4 is characterized in that in the pulse signal generating device set out in claim 2 or 3, a monopulse signal generation circuit is integrated into the radiation type oscillator.

Further, the invention according to claim 5 is characterized in that in the pulse signal generating device set out in any of claims 1 to 4, a band-pass filter means for selectively filtering waves of required frequency is provided to be disposed an appropriate distance apart from the radiation surface of the radiation type oscillator.

Further, the invention according to claim 6 is characterized in that in the pulse signal generating device set out in any of claims 1 to 5, a grounding conductor structure is provided on the radiation direction side of the radiation type oscillator for preventing leakage of unnecessary signal components of a frequency lower than the frequency of the radiated high-frequency pulse signal.

In accordance with the invention of claim 1, a radiation type oscillator is configured to integrate a three-electrode high-frequency amplifying device to generate negative resistance in a resonant cavity and share an antenna function for radiating an electromagnetic wave into space; the three-electrode high-frequency amplifying device is momentarily operated to establish a short-duration negative resistance and a high-frequency pulse signal of an oscillating frequency/frequency band width determined based on the negative resistance and the structure of the resonant cavity is generated and simultaneously radiated into space, whereby the structure is simple, design is uncomplicated, and compact integration and cost reduction are easy. This simple structure is a feature that suppresses variation in characteristics, is beneficial from the aspect of achieving high yield in production, and also advantageous for ensuring high reliability. Particularly in the production of a milliwave device requiring precise and fine film processing technology, structural simplicity of the device is extremely advantageous from the aspect of quality control.

Further, since the oscillator and antenna form a harmonious whole, the high-frequency pulse signal is radiated into space as soon as it is generated, so that there is no transmission loss because no transmission line for supplying power to the antenna is present, and the DC/RF conversion efficiency is therefore high and power consumption low. In addition, the oscillation is of very short duration, with a transistor being intermittently operated to pass current for short periods, and power consumption is therefore low.

In addition, since by operating principle no CW signal leakage (single spectrum) appears at the center of the radiated UWB spectrum in the pulse signal generating device according to claim 1, there is the advantage of being able to efficiently utilize the band within the legally defined UWB communication spectral mask.

Moreover, the conventional pulse signal generating device is configured to generate a high-frequency pulse signal by rapid discharge with a switch circuit or using a resonator or filter circuit to select a certain part of the frequency components of a base band signal, which makes it necessary for the rapid discharge or the base band signal itself to contain the radiated high-frequency signal component in advance and therefore increases cost because the switch circuit or base band signal oscillator circuit is required to have ultra-high speed, while, in contrast, the pulse signal generating device according to claim 1 does not require a rapid discharge or base band signal containing the radiated high-frequency signal component in advance, so that it has good designability and is advantageous for cost reduction.

Thanks to the foregoing advantages, the pulse signal generating device according to claim 1 can be effectively realized with simpler structure, higher performance, more compact integration, lower power consumption and lower cost than in the case of configuring a device with the same performance using conventional technology.

Further, the invention according to claim 2 is characterized in being configured so that in the pulse signal generating device set out in claim 1, the three electrodes of the three-electrode high-frequency amplifying device of the radiation type oscillator are a controlled current inflow electrode, a controlled current outflow electrode and a control electrode; and a monopulse signal is supplied to the controlled current inflow electrode or the controlled current outflow electrode and the power of the monopulse signal itself is used as source power to establish short-duration negative resistance, whereby no power source is required for establishing negative resistance, thus enabling the pulse signal generating device to be realized with a simple structure at relatively low cost.

Further, in accordance with the invention of claim 3, the three electrodes of the three-electrode high-frequency amplifying device of the radiation type oscillator are a controlled current inflow electrode, a controlled current outflow electrode and a control electrode; and direct current is supplied to the controlled current inflow electrode or the controlled current outflow electrode and a monopulse signal is supplied to the control electrode to cause short-duration controlled current to flow and establish short-duration negative resistance, whereby even a circuit of small load driving capability can be used as the monopulse signal generation circuit, thus enabling the pulse signal generating device to be realized with a simple structure at relatively low cost.

Further, in accordance with the invention of claim 4, the monopulse signal generation circuit is integrated into the radiation type oscillator, whereby the issue of multiple reflection between the radiation type oscillator and the monopulse signal generation circuit can be easily avoided, thus enabling the pulse signal generating device to be realized with a simple structure at relatively low cost.

Further, in accordance with the invention of claim 5, a band-pass filter means for selectively filtering waves of required frequency is provided to be disposed an appropriate distance apart from the radiation surface of the radiation type oscillator, whereby radiation of unnecessary signals can be prevented and a desired harmonic frequency component can be selected and radiated, thus making it possible to acquire a higher-quality radiation signal.

Further, in accordance with the invention of claim 6, a grounding conductor structure is provided on the radiation direction side of the radiation type oscillator for preventing leakage of unnecessary signal components of a frequency lower than the frequency of the radiated high-frequency pulse signal, whereby leakage of the base band signal and base band pulse signal components and radiation of unnecessary signals can be prevented, thus making it possible to acquire a higher quality radiation signal.

BEST MODES FOR CARRYING OUT THE INVENTION

Next, embodiments of the pulse signal generating device according to the present invention will be explained based on the attached drawings.

Figure 1A:
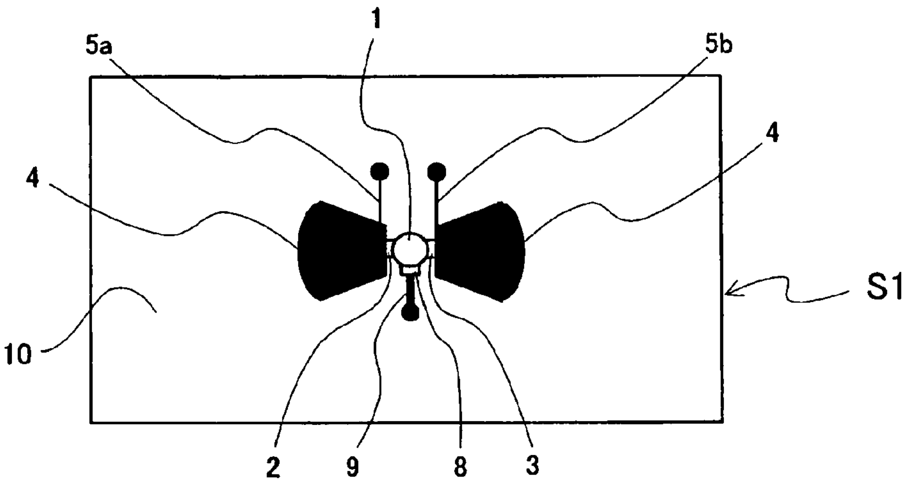
FIG. 1 is a set of schematic diagrams of a radiation type oscillator substrate in a pulse signal generating device according to a first embodiment of the present invention.
Figure 1B:
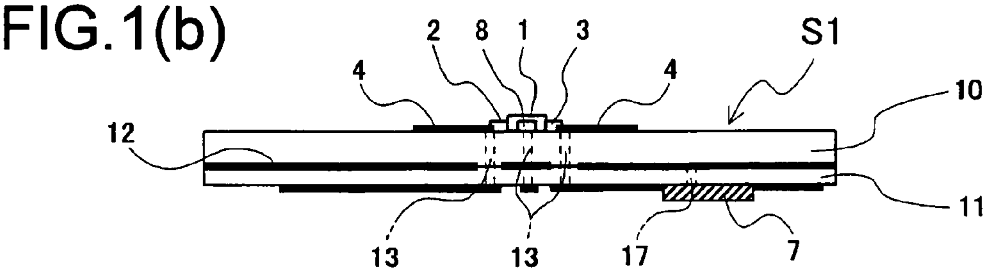
Figure 1C:
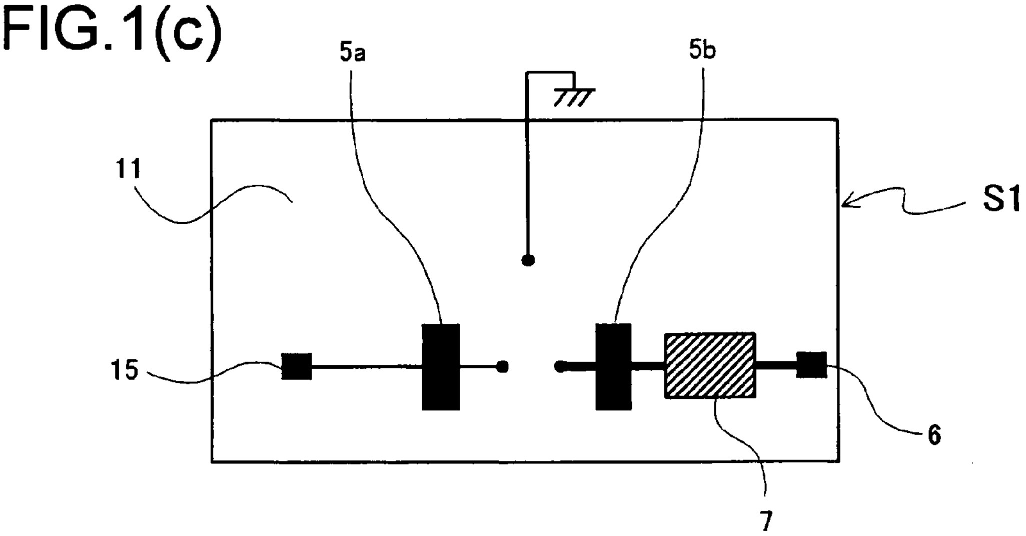

FIG. 1 shows the basic configuration of a pulse signal generating device (drain-driven high-frequency pulse signal generating device) according to the first embodiment, which pulse signal generating device comprises a radiation type oscillator substrate S1, a signal source that supplies a base band signal thereto (not shown), and a power supply that performs DC bias feed (not shown).

The radiation type oscillator substrate S1 here functions as a "radiation type oscillator that integrates a three-electrode high-frequency amplifying device to generate negative resistance in a resonant cavity and shares an antenna function for radiating an electromagnetic wave into space."

Further, the three-electrode high-frequency amplifying device is an element that can realize amplification capability by controlling a large current with a small voltage or current, inclusive of an element configured using a discrete transistor element or multiple discrete transistors, but is not limited to parts that can be handled individually and can include one built into a semiconductor wafer by a semiconductor process. The control electrode in this three-electrode high-frequency amplifying device is an electrode, corresponding to a gate or base, that is applied with a control voltage or made to accept inflow (or outflow) of a control current. Further, the controlled current inflow electrode is an electrode into which the controlled current flows, and the controlled current outflow electrode is an electrode from which the controlled current flows out, one corresponding to a drain or collector and the other to a source or emitter, depending on whether the element structure is N type or P type, or is NPN type or PNP type.

The radiation type oscillator substrate S1 configures the required circuits using a three-layer substrate with an inner-layer GND 12 constituting a grounding conductor layer sandwiched between a front-side dielectric substrate 10 and a rear-side dielectric substrate 11. Specifically, an RF circuit section of the radiation type oscillator is constituted by the front surface and the inner-layer GND 12, and an RF choke circuit and a base band circuit are constituted by the inner-layer GND 12 and the rear surface. Note that FIG. 1(*a*) shows the plane of the radiation type oscillator substrate S1 (front of the front-side dielectric substrate 10), FIG. 1(*b*) schematically shows the vertical cross-sectional structure of the radiation type oscillator substrate S1, and FIG. 1(*c*) shows the bottom surface of the radiation type oscillator substrate S1 (rear surface of the rear-side dielectric substrate 11).

A pair of conductor patches 4, 4 are provided axial-symmetrically on the front side of the front-side dielectric substrate 10 to form a radiation surface, a gate electrode 2 constituting the control electrode and a drain electrode 3 constituting the controlled current inflow electrode of a high-frequency transistor 1 constituting the three-electrode high-frequency amplifying device and disposed between the pair of conductor patches 4, 4 are respectively connected to the conductor patches 4, 4, and an RF choke circuit 5*a* for supplying gate DC bias voltage is connected to the gate electrode 2. Voltage is fed from an unshown DC power supply to this RF choke circuit 5*a* through a DC gate voltage feed terminal 15. Further, a conductor patch 4 and an RF choke circuit 5*b* are connected to the drain electrode 3. A monopulse generation circuit 7 (configured of a high-speed logic IC and a switch, for example) is series-connected between the RF choke circuit 5*b* and the base band signal input terminal 6. The GND of the monopulse generation circuit 7 is connected to the inner-layer GND 12 via a through-hole 17. An impedance line 9 satisfying an oscillation condition is connected to a source electrode 8 constituting the controlled current outflow electrode of the high-frequency transistor 1 and through-hole grounded to the inner-layer GND 12. And the high-frequency transistor 1, the conductor patches 4, part of the RF choke circuits 5*a*, 5*b*, and the impedance line 9 are formed on the surface of the front-side dielectric substrate 10 (surface of the high-frequency pulse radiation side), and the remaining portions of the RF choke circuits 5*a*, 5*b* and the monopulse generation circuit 7 are formed on the rear side of the rear-side dielectric substrate 11. The RF choke circuits 5*a*, 5*b* include through-hole portions 13.

The conductor patches 4 here function as a resonator and antenna, and constitute a feedback circuit. A radiation type oscillator that generates and radiates an RF signal is realized by area/shape design and the like of the conductor patches 4 and the DC current fed to the high-frequency transistor.

Figure 2:
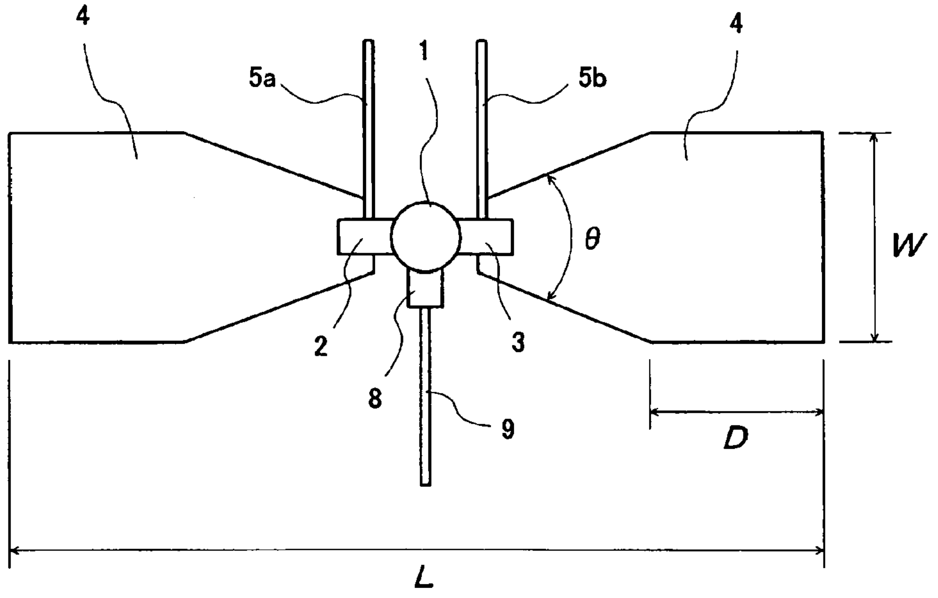
FIG. 2 is an explanatory configuration diagram of conductor patches and a microwave transistor in a radiation type oscillator.

FIG. 2 shows the pair of axial symmetrical conductor patches 4, which conductor patches 4 each has a tapered portion of equiangular inclination that is connected to the gate electrode 2 or drain electrode 3 of the high-frequency transistor 1, and the tapered portions are disposed in close proximity with the lengths D of the parallel portions of equal width W located beyond the pointed portions defined as D and the distance from one end to the other end of the pair of conductor patches 4 (total length) defined as L.

In the so-configured conductor patches 4, the coupling strength of the high-frequency transistor 1 and resonator can be regulated by regulating the divergence angle θ of the tapered portions connected to the gate electrode 2 or drain electrode 3 of the high-frequency transistor 1, and freedom in selecting the various conditions necessary for setting the oscillation condition can be obtained by appropriately selecting the length L, width W and parallel portion length D. Further, although not shown in the drawings, a stable oscillating condition can be ensured by setting the interval h between the conductor patches 4 and the inner-layer GND 12 (substantially the thickness of the front-side dielectric substrate 10) at between 1/15 and 1/5 the oscillating wavelength λ. Note that the configuration of the conductor patches 4 is not particularly limited and any structure is acceptable insofar a resonant cavity suitable for the generated RF signal can be configured by the front-side dielectric substrate 10 and inner-layer GND 12. Modifications of the resonant cavity will be explained later.

In order to operate the radiation type oscillator substrate S1 of the foregoing configuration, a suitable DC bias voltage is applied to the DC gate voltage feed terminal 15, and a base band signal for operating the monopulse generation circuit 7 is input to the base band signal input terminal 6. The monopulse output signal from the monopulse generation circuit 7 is input to the drain electrode 3 of the high-frequency transistor 1 through the RF choke circuit 5*b*, the monopulse output signal itself becomes the power source voltage, and negative resistance is produced by the high-frequency transistor 1 for a short-duration. Short-duration RF band generation and radiation, namely generation and radiation of a high-frequency pulse signal, occurs at the frequency and bandwidth determined by this short-duration negative resistance and the structures of the conductor patches 4 and front-side dielectric substrate 10.

Note that if the oscillation condition is satisfied while the monopulse signal is being input to the drain electrode 3, the DC bias voltage applied to the DC gate voltage feed terminal 15 can be applied by self-biasing without need to supply it from an external power supply. For example, if the oscillation condition is satisfied by the gate bias voltage of 0 [V], a power supply for DC bias for feeding DC bias is unnecessary if the DC gate voltage feed terminal 15 is electrically connected to the inner-layer GND or the like to apply 0 [V] to the gate.

The waveform of the aforesaid monopulse signal is not particularly limited and can be rectangular, Gaussian or triangular. Moreover, the rise time of the waveform does not need rapidity. For example, considering a triangular waveform, it is not necessary for the radiated high-frequency signal component to be contained in the triangular waveform signal. Considering the rise from the trough to the peak of the crest of the triangular waveform, insofar as the oscillation condition is satisfied a little before the crest thereof and the oscillation condition is departed from a little after the crest thereof, it is acceptable even if the rise time should be long. This is because the radiated high-frequency signal component depends on the negative resistance and the resonant cavity structure.

Figure 3:
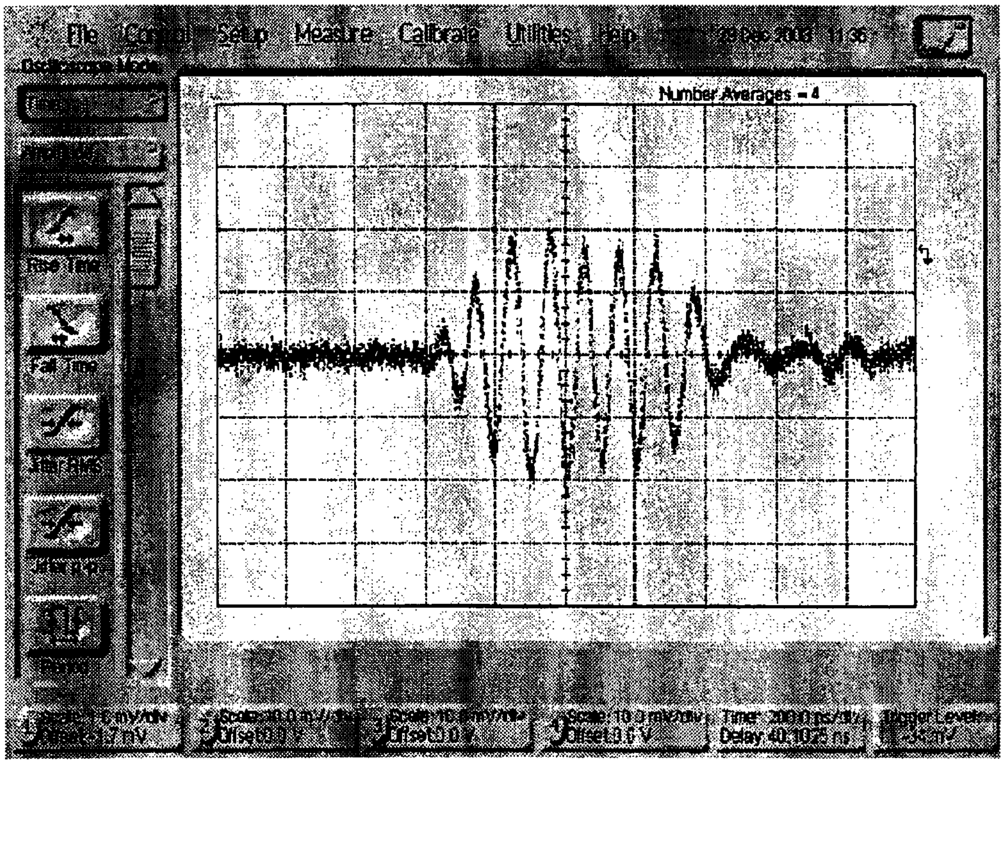
FIG. 3 is a wave diagram of a measured high-frequency pulse signal radiated by a pulse signal generating device according to the present invention.

An X-band pulse signal generating device according to the present embodiment was actually fabricated, and a wave diagram obtained by measuring the radiated high-frequency pulse signal radiated is shown in FIG. 3. The pulse width of the signal shown in FIG. 3 was about 600 picosecond.

Thus the pulse signal generating device according to the present embodiment is simple in structure, suppresses variation in characteristics, is beneficial from the aspect of achieving high yield in production, and also advantageous for ensuring high reliability. Particularly in the production of a milliwave device requiring precise and fine film processing technology, structural simplicity of the device is extremely advantageous from the aspect of quality control.

Further, since the radio source itself operates as an antenna, no consideration need be given to impedance matching between the radio source and antenna, bandwidth control or group delay, and ultra-wideband matching between the radio source and free space is established when the radio source exists, whereby generation and radiation of a high-frequency pulse signal with little degradation is possible.

Further, as the resonant cavity Q can easily be set low, compatibility with generation and radiation of a very short pulse width high-frequency pulse signal can be achieved, which is ideal for realizing a high-performance UWB device. In the case of application to a UWB communication device, a high-frequency pulse signal of short pulse width is advantageous for high transmission rate communication. In the case of application to an impulse UWB radar device, a short pulse-width high-frequency pulse signal is advantageous for high-resolution distance detection.

Further, there is no transmission loss because no transmission line for supplying power to the antenna is present, so that the DC/RF conversion efficiency is high and power consumption low. In addition, the oscillation is of very short duration, with a transistor being intermittently operated to pass current for short periods, and power consumption is therefore extremely low, which is particularly advantageous at the time of application to battery-operated mobile equipment.

Moreover, in the conventional pulse signal generating device configured to generate a high-frequency pulse signal by combining a CW signal oscillator and a high-speed RF switch, there is a problem of CW signal leakage (single spectrum) appearing at the center of the radiated UWB spectrum because the CW signal oscillator is in operation, while in the pulse signal generating device according to the present invention, since by operating principle no such CW signal leakage appears, there is the advantage of being able to efficiently utilize the band within the legally defined UWB communication spectral mask.

Further, in the pulse signal generating device configured to generate a high-frequency pulse signal by rapid discharge with a switch circuit or using a resonator or filter circuit to select a certain part of the frequency components of a base band signal, the rapid discharge or the base band signal itself must contain the radiated high-frequency signal component in advance. Cost therefore becomes high because the switch circuit or base band signal oscillator circuit is required to have ultra-high speed, while, in contrast, the pulse signal generating device according to the present invention does not require a rapid discharge or base band signal containing the radiated high-frequency signal component in advance, so that it has good designability and is advantageous for cost reduction.

Thus, the pulse signal generating device according to the present embodiment can be configured using a radiation type oscillator of simple structure to enable high performance, compact integration, easy design, low power consumption, and low cost.

Figure 4A:
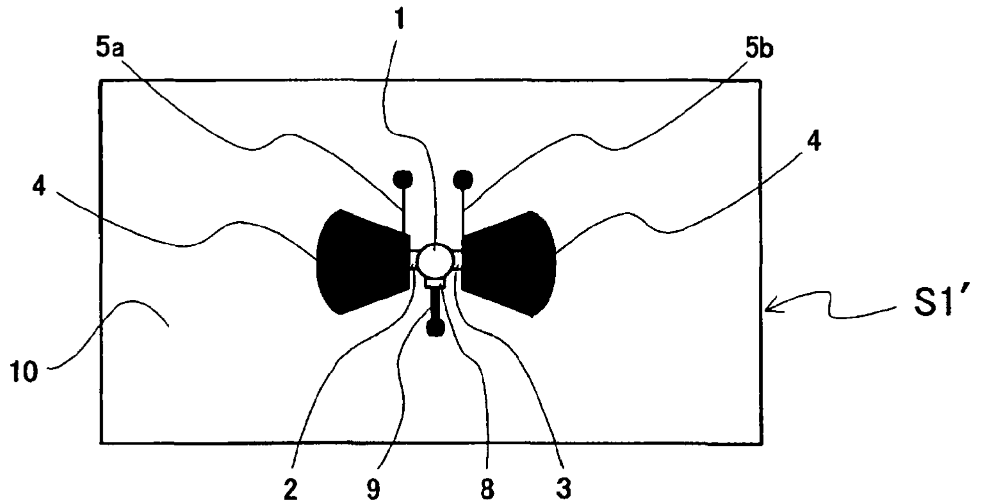
FIG. 4 is a set of schematic diagrams of the radiation type oscillator substrate in the pulse signal generating device according to the first embodiment, equivalently modified.
Figure 4B:
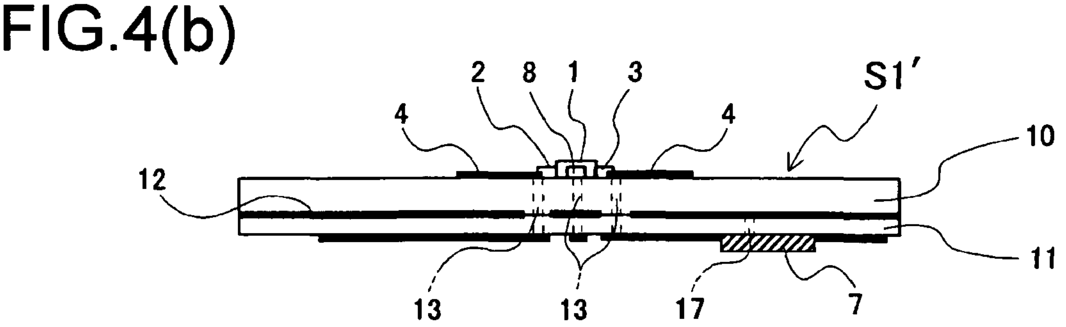
Figure 4C:
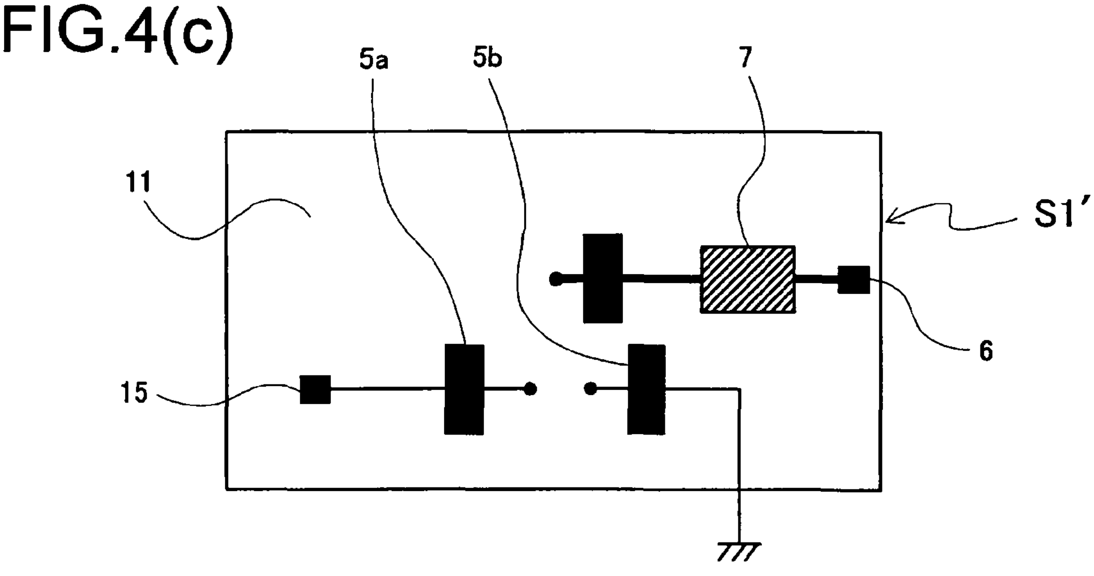

Note that it is acceptable, as in the radiation type oscillator substrate S1' shown in FIG. 4, to connect the monopulse generation circuit 7 to the source electrode 8 so as to supply the monopulse signal to the source electrode 8 constituting the controlled current outflow electrode. In this case, if a negative monopulse signal is output from the monopulse generation circuit 7, the ground potential merely changes from the source electrode to the drain electrode, and since there is only a change in the reference potential, operation as a pulse signal generating device is the same. Further, the electrode to which the monopulse signal is supplied can be appropriately selected depending on whether the transistor constituting the three-electrode high-frequency amplifying device is N type or P type, or is NPN type or PNP type.

Figure 5A:
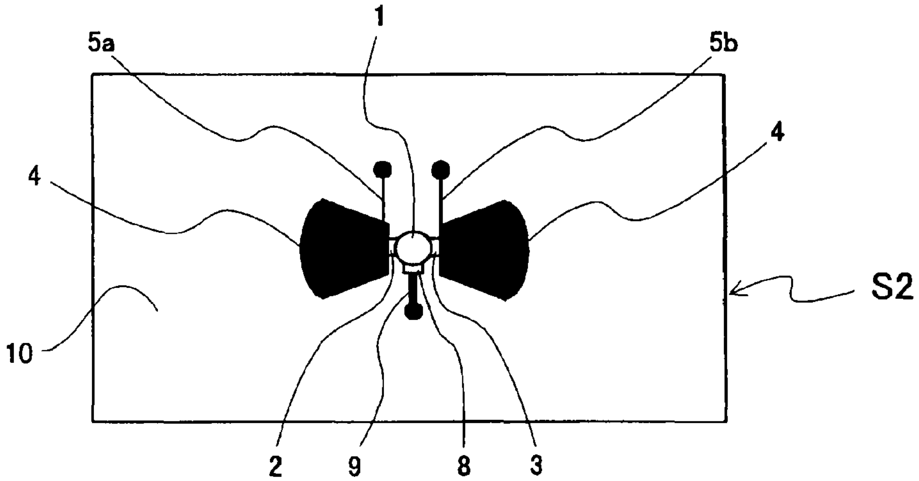
FIG. 5 is a set of schematic diagrams of a radiation type oscillator substrate in a pulse signal generating device according to a second embodiment of the present invention.
Figure 5B:
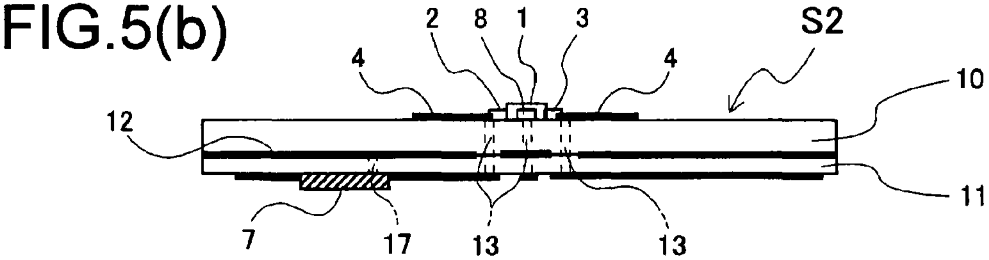
Figure 5C:
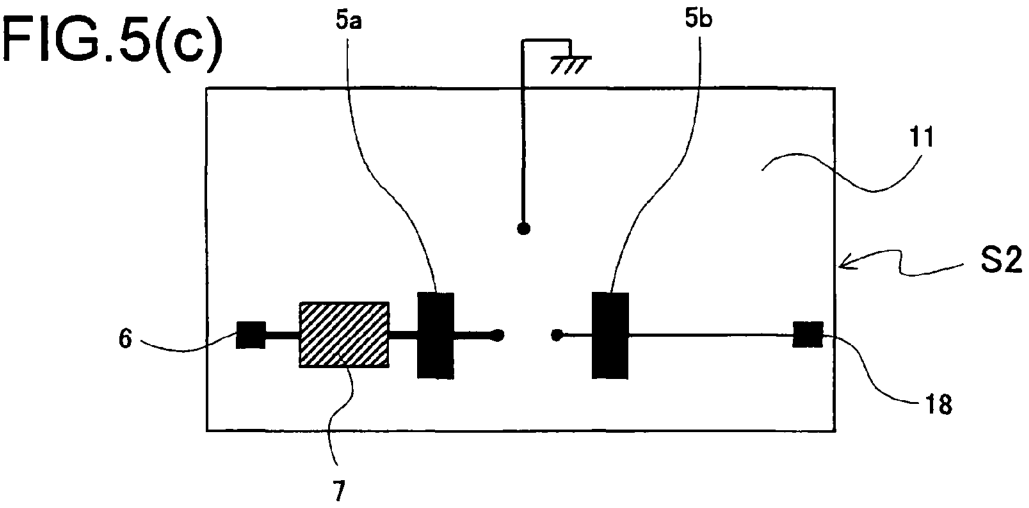

A pulse signal generating device according to a second embodiment (gate-driven high-frequency pulse signal generating device) will be explained next based on FIG. 5.

The pulse signal generating device of the present embodiment comprises a radiation type oscillator substrate S2, a signal source that supplies a base band signal thereto (not shown), and a power supply that performs DC bias feed (not shown). Further, the radiation type oscillator substrate S2 of the pulse signal generating device of the present embodiment configures the required circuits using a three-layer substrate with an inner-layer GND 12 constituting a grounding conductor layer sandwiched between a front-side dielectric substrate 10 and a rear-side dielectric substrate 11; an RF circuit section of the radiation type oscillator is constituted by the front surface and the inner-layer GND 12; and an RF choke circuit and a base band circuit are constituted by the inner-layer GND 12 and the rear surface. Note that FIG. 5(*a*) shows the plane of the radiation type oscillator substrate S2 (front of the front-side dielectric substrate 10), FIG. 5(*b*) schematically shows the vertical cross-sectional structure of the radiation type oscillator substrate S2, and FIG. 5(*c*) shows the bottom surface of the radiation type oscillator substrate S2 (rear surface of the rear-side dielectric substrate 11).

A conductor patch 4 and an RF choke circuit 5*a* for supplying a monopulse signal are connected to a gate electrode 2 of a high-frequency transistor 1. A conductor patch 4 and an RF choke circuit 5*b* for supplying drain voltage are connected to the drain electrode 3 of the high-frequency transistor 1. Power is supplied from an unshown direct current source through a DC drain feed terminal 18 to the RF choke circuit 5*b*. A monopulse generation circuit 7 is series-connected between the RF choke circuit 5*a* and a base band signal input terminal 6. An impedance line 9 satisfying an oscillation condition is connected to the source electrode 8 of the high-frequency transistor 1 and grounded. The high-frequency transistor 1, the conductor patches 4, part of the RF choke circuits 5*a*, 5*b*, and the impedance line 9 are formed on the surface of the front-side dielectric substrate 10 (surface of the high-frequency pulse radiation side), and the remaining portions of the RF choke circuits 5*a*, 5*b* and the monopulse generation circuit 7 are formed on the rear side of the rear-side dielectric substrate 11. The RF choke circuits 5*a*, 5*b* include through-hole portions 13.

In order to operate the radiation type oscillator substrate S2 of the foregoing configuration, a suitable DC voltage is applied to the DC drain voltage feed terminal 18, and a base band signal for operating the monopulse generation circuit 7 is input to the base band signal input terminal 6. The monopulse output signal from the monopulse generation circuit 7 is input to the gate electrode 2 of the high-frequency transistor 1 through the RF choke circuit 5*a*, this monopulse signal opens the gate for a short duration, short-duration drain current flows, and negative resistance is produced by the high-frequency transistor 1 for a short-duration. Short-duration RF band generation and radiation, namely generation and radiation of a high-frequency pulse signal, occurs at the frequency and bandwidth determined by this short-duration negative resistance and the structures of the conductor patches 4 and front-side dielectric substrate 10.

Note that in the present embodiment, the gate of the high-frequency transistor 1 is opened by the monopulse signal voltage, making it is necessary to set a suitable bias voltage so that the gate assumes a closed state (pinch off) at the time of no signal (during the period between a given monopulse and the next monopulse).

The waveform of the aforesaid monopulse signal is not particularly limited and can be rectangular, Gaussian or triangular. Moreover, the rise time of the waveform does not need rapidity. For example, considering a triangular waveform, it is not necessary for the radiated high-frequency signal component to be contained in the triangular waveform signal. Considering the rise from the trough to the peak of the crest of the triangular waveform, insofar as the oscillation condition is satisfied a little before the crest thereof and the oscillation condition is departed from a little after the crest thereof, it is acceptable even if the rise time should be long. This is because the radiated high-frequency signal component depends on the negative resistance and the resonant cavity structure.

Thus, the pulse signal generating device of the present embodiment requires only that the gate can be ON/OFF controlled with respect to the high-frequency transistor 1, which makes it possible to use a monopulse generation circuit of lower output power and lower drive capacity than in the aforesaid first embodiment and thus to realize a pulse signal generating device that is simple in structure and relatively low in cost.

Figure 6A:
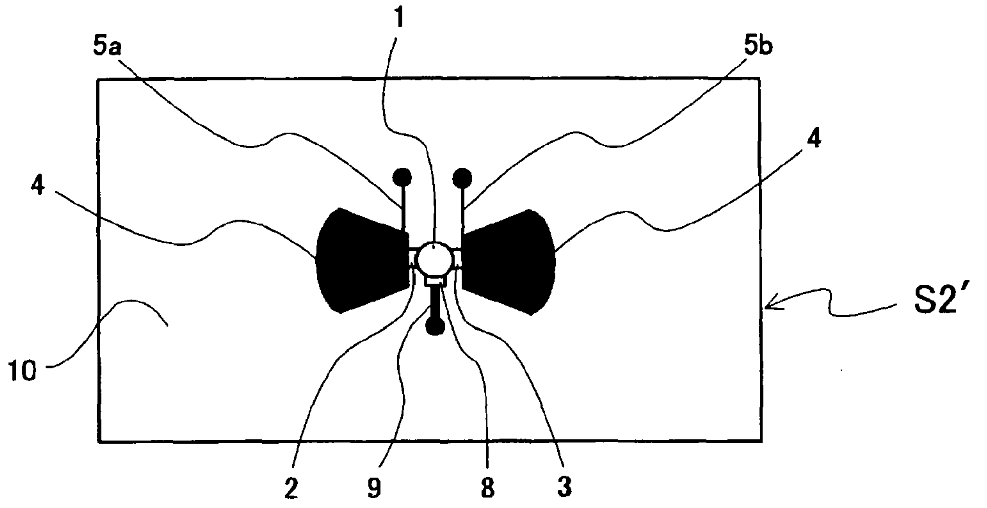
FIG. 6 is a set of schematic diagrams of the radiation type oscillator substrate in the pulse signal generating device according to the second embodiment, equivalently modified.
Figure 6B:
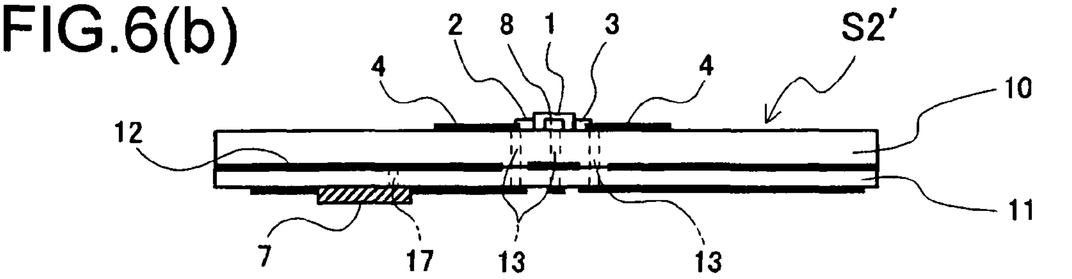
Figure 6C:
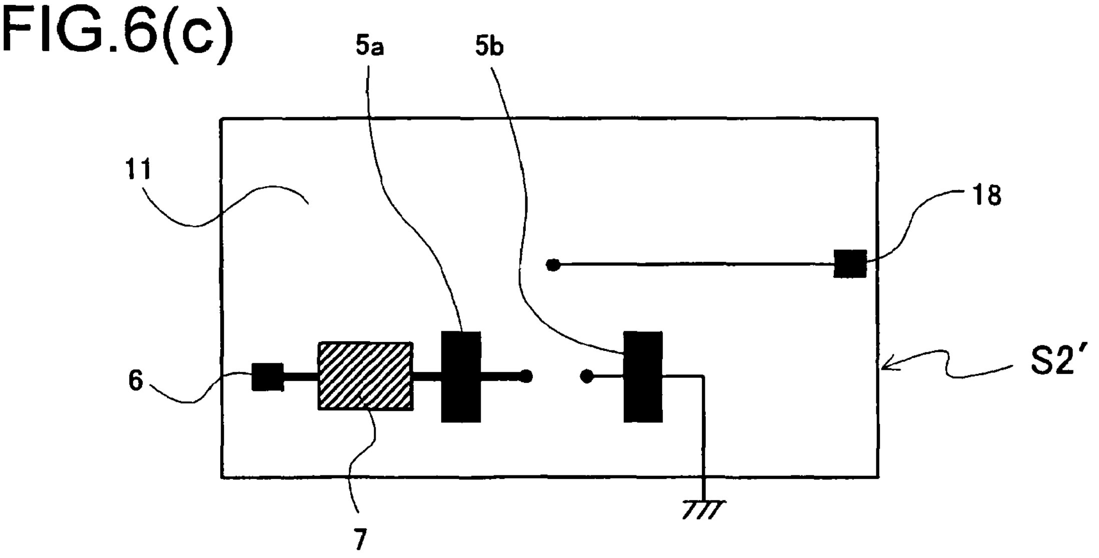

Note that it is acceptable, as in the radiation type oscillator substrate S2' shown in FIG. 6, to supply direct current to the source electrode 8 constituting the controlled current outflow electrode. In this case, if a negative DC voltage is supplied to the source electrode, the ground potential merely changes from the source electrode to the drain electrode, and since there is only a change in the reference potential, operation as a pulse signal generating device is the same Further, the electrode to which the direct current is supplied can be appropriately selected depending on whether the transistor constituting the three-electrode high-frequency amplifying device is N type or P type, or is NPN type or PNP type.

Further, the high-frequency transistor 1 used as the three-electrode high-frequency amplifying device for configuring the radiation type oscillator in the pulse signal generating device according to the aforesaid embodiments is, for example, a field effect transistor (FET) such as an IG-FET (Insulated Gate FET), HEMT (High Electron Mobility Transistor), MESFET (Metal-Semiconductor FET), inclusive of a MOS-FET, or a bipolar transistor (BJT: Bipolar Junction Transistor) such as an HBT (Hetero-junction Bipolar Transistor), and the type is not particularly limited insofar as it has amplification capability that controls a large current with a small voltage or current.

Further, the internal structure of the three-electrode high-frequency amplifying device is not particularly limited either, and an element of a structure combining multiple discrete transistors, such as Darlington connected transistors or cascade connected transistors, is acceptable. For example, in the case of using Darlington connected transistors, there is the advantage of being able to obtain a high current amplification factor unattainable with discrete transistors.

Further, the pulse signal generating device according to the embodiments set out in the foregoing can be implemented with an HMIC (hybrid microwave integrated circuit) or can be implemented with an MMIC (Monolithic Microwave integrated circuit). Moreover, it can be implemented with a three-dimensional integrated circuit using a LTCC (Low Temperature Co-fired Ceramics) or the like. In other words, as seen in the radiation type oscillator substrates S1~S2 shown in the first and second embodiments, a high-frequency transistor 1 that is a discrete part need not be mounted on the substrate, and the three-electrode high-frequency amplifying device can be monolithically built into a semiconductor wafer together with the resonant cavity (conductor patches or the like) by the same semiconductor process. Of particular note is that since the size of the resonant cavity is small owing to the short wavelength of the milliwave band radio wave, building in the three-electrode high-frequency amplifying device monolithically (MMIC) enables further miniaturization and weight reduction and has the advantage of enabling high product quality and high productivity by high-precision semiconductor processing technology.

Further, although the function of the RF choke circuits in the pulse signal generating device according to the embodiments set out in the foregoing is to prevent the RF signal from leaking to the DC power supply side or the monopulse generation circuit 7 side, even if the RF signal should leak, operation of the radiation type oscillator will nevertheless be possible so long as the high-frequency transistor 1 can produce negative resistance exceeding the loss by the leakage. Therefore, even if the present invention is configured using a radiation type oscillator not equipped with RF choke circuits, a pulse signal generating device can still be realized. Moreover, if the monopulse generation circuit 7 itself is a high impedance circuit in the RF band, the monopulse generation circuit 7 and the radiation type oscillator can be directly integrated to make the RF choke circuits unnecessary. In addition, the radiation type oscillator substrate of three-layer substrate structure is not required for forming the RF choke circuits.

Further, the monopulse generation circuit 7 in the radiation type oscillator according to the embodiments set out in the foregoing can be configured as a high-speed logic IC or switch, or otherwise as a circuit or the like using a Step Recovery Diode (SRD) or Nonlinear Transmission Line (NLTL). A monopulse generation circuit configured using an SRD or NLTL can make a DC power source unnecessary, so that if supply of gate bias voltage is also omitted by self-biasing the high-frequency transistor 1, a high-frequency pulse signal generating device that operates with no DC power source present can be realized. The pulse signal generating device in this case operates like a frequency-up converter that signal-converts an RF band high-frequency pulse signal from the base band signal notwithstanding that no DC power source or local oscillator is present, thus offering a simple and easy-to-use configuration.

Further, although the pulse signal generating device according to the embodiments set out in the foregoing is provided on the radiation type oscillator substrate S with the pair of approximately fan-shaped conductor patches 4, the shape of the conductor patches constituting the resonant cavity is not particularly limited and a pair of axially symmetrical patches is not essential. Modifications of conductor patches applicable in the present invention are explained below.

Figure 7A:
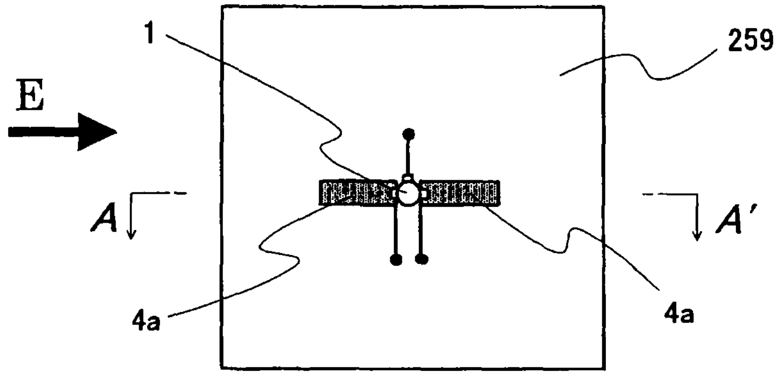
FIG. 7 is a set of schematic diagrams of a first configuration example of a resonant cavity applicable in the present invention.
Figure 7B:
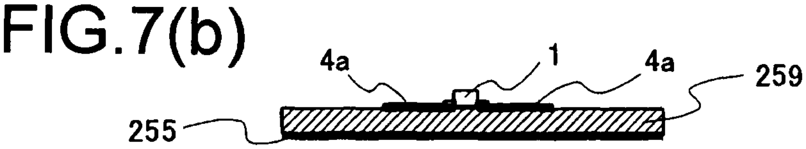
Figure 8A:
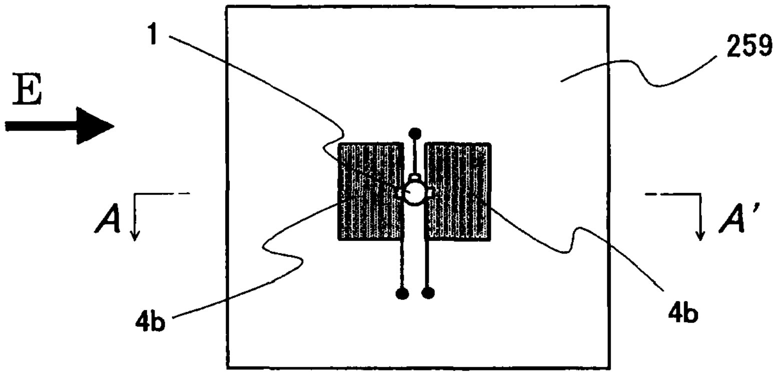
FIG. 8 is a set of schematic diagrams of a second configuration example of a resonant cavity applicable in the present invention.
Figure 8B:
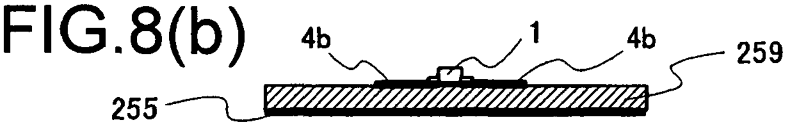
Figure 9A:
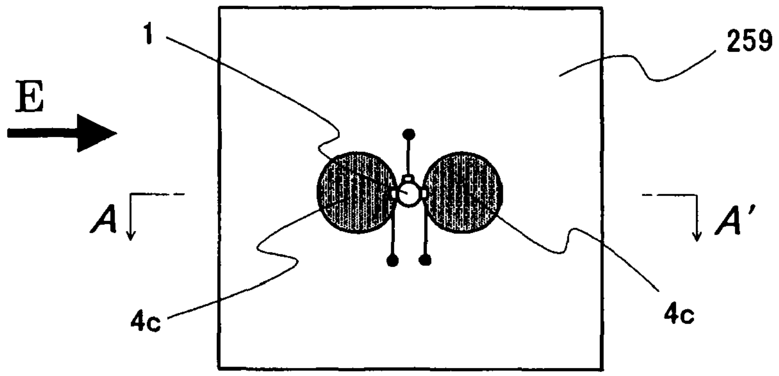
FIG. 9 is a set of schematic diagrams of a third configuration example of a resonant cavity applicable in the present invention.
Figure 9B:
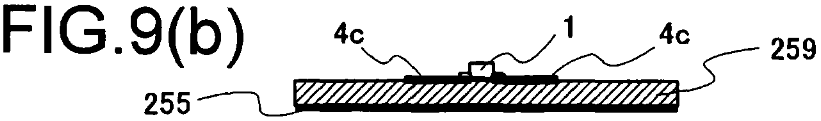
Figure 10A:
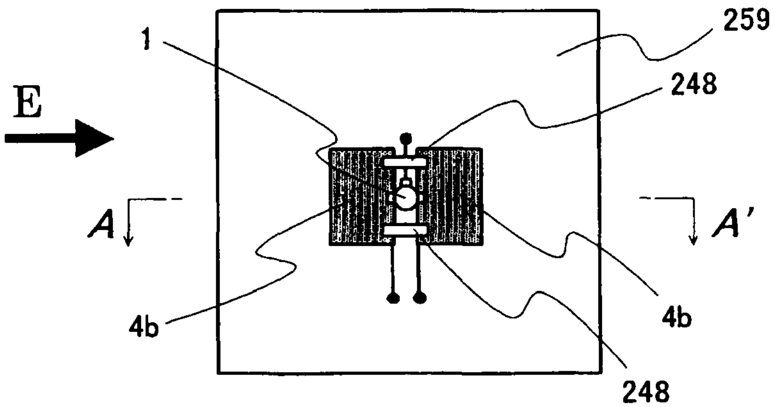
FIG. 10 is a set of schematic diagrams of a fourth configuration example of a resonant cavity applicable in the present invention.
Figure 10B:
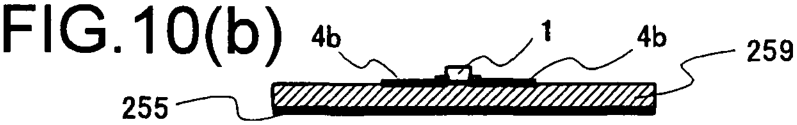

FIG. 7 is a first modification provided axial-symmetrically with a pair of rectangular conductor patches 4*a*, FIG. 8 is second modification provided axial-symmetrically with a pair of rectangular conductor patches 4*b*, and FIG. 9 is third modification provided axial-symmetrically with a pair of circular conductor patches 4*c*. In addition, the conductor patches can, for example, be polygonal, i.e. triangular, or elliptical or fan-shaped. In FIGS. 7~9, the direction of the electric field is shown by an arrow E in order to indicate the main plane of polarization. For the conductor patches 4*a*~4*c*, the GND conductor surface 255 corresponds to the inner-layer GND 12. For the conductor patches 4*a*~4*c*, the dielectric substrate 259 corresponds to the front-side dielectric substrate 10. The conductor patches 4*a*~4*c*, GND conductor surface 255 and dielectric substrate 259 form a resonant cavity and form part of a feedback circuit for oscillating operation, but if the feedback can be appropriately obtained, provision of the dielectric substrate 259 and GND conductor surface 255 is not absolutely necessary. For example, if the conductor patches are fabricated by sheet-metal working and a mechanism for retaining the conductor patches is available, the dielectric substrate 259 portion can be hollow. Further, as seen in the fourth modification shown in FIG. 10, feedback parts 248, such as a chip capacitor for promoting the feedback, can be mounted on the conductor patches 4*b*. Note that the radiation when the GND conductor surface 255 is not present is in the direction of both surfaces of the conductor patch substrates.

Figure 11A:
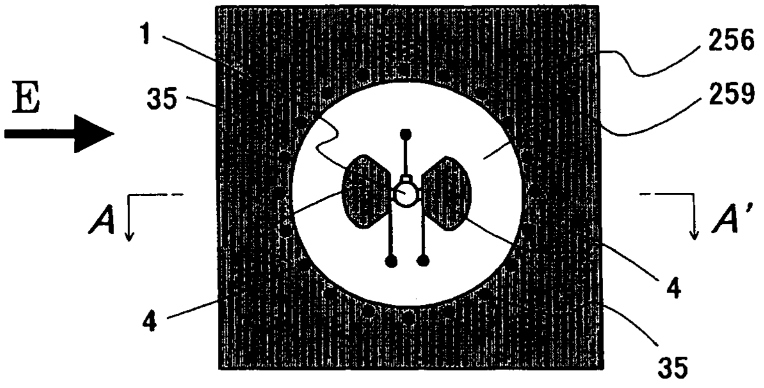
FIG. 11 is a set of schematic diagrams of a fifth configuration example of a resonant cavity applicable in the present invention.
Figure 11B:
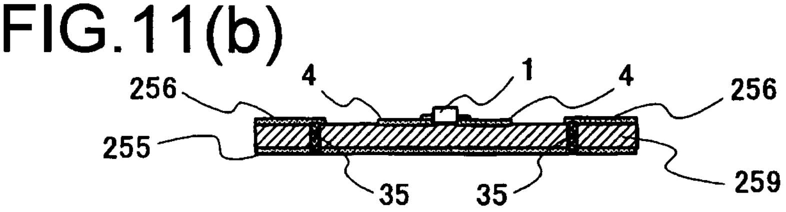

The fifth modification shown in FIG. 11 is an example in which a signal transmitted through the interior of the dielectric substrate 259 is prevented from leakage and loss from the edge of the substrate by surrounding approximately fan-shaped conductor patches 4, 4 with a GND conductor surface 256 and through-holes 35 connecting the GND conductor surface 256 and a GND conductor surface 255. Instead of transmitting the signal inside the dielectric substrate 259, it is possible by appropriately defining the dimensions and shape of the GND conductor surface 256 to use the lost signal energy for its original purpose as radiation energy.

Figure 12A:
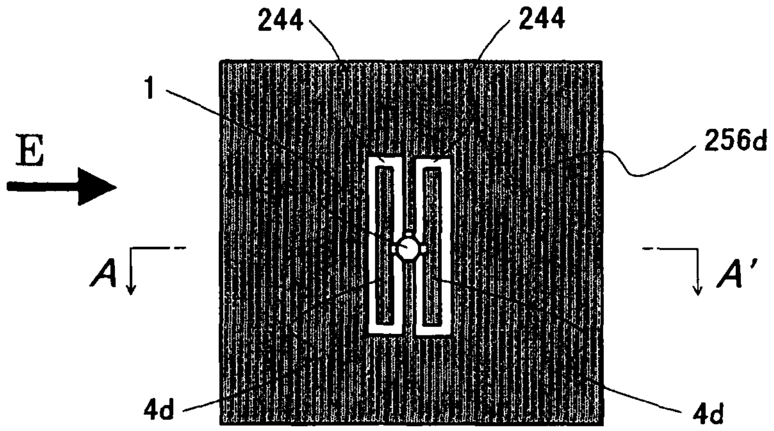
FIG. 12 is a set of schematic diagrams of a sixth configuration example of a resonant cavity applicable in the present invention.
Figure 12B:
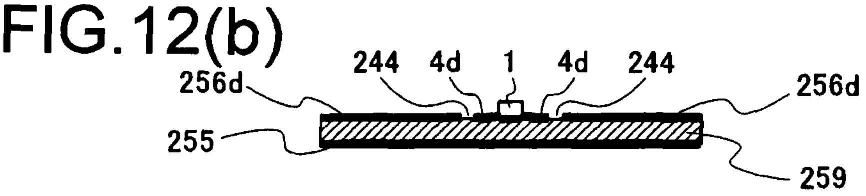

Shown in FIG. 12 is a sixth modification in which a resonant cavity for oscillation is configured by rectangular conductor patches 4*d*, 4*d* and a ground conductor surface 256*d* arranged to maintain appropriate gaps 244 with respect to the conductor patches 4*d*, 4*d*.

Figure 13A:
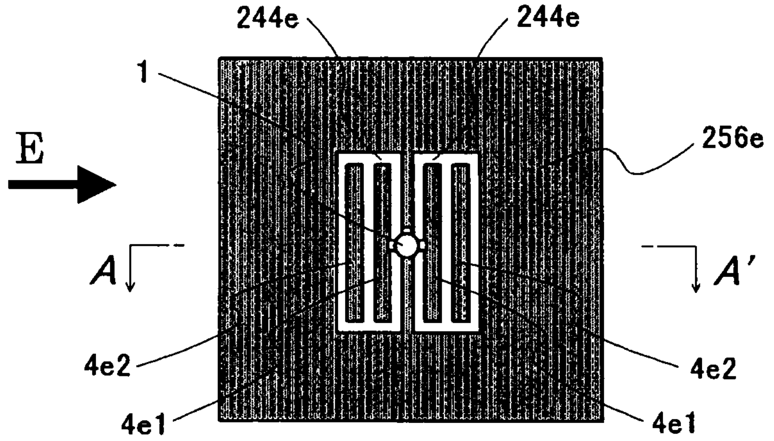
FIG. 13 is a set of schematic diagrams of a seventh configuration example of a resonant cavity applicable in the present invention.
Figure 13B:
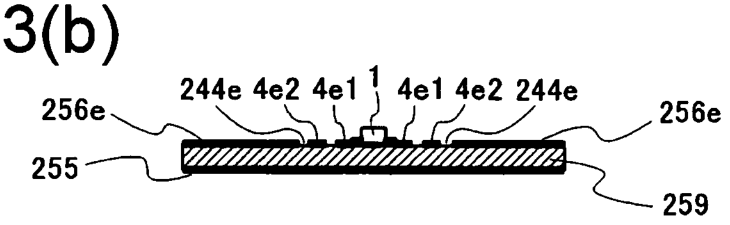

Shown in FIG. 13 is a seventh modification in which a resonant cavity for oscillation is configured by providing rectangular conductor patches 4*e*2, 4*e*2 not connected to a high-frequency transistor 1 near rectangular conductor patches 4*e*1, 4*e*1 connected to the high-frequency transistor 1 and spacing the conductor patches 4*e*1 from the conductor patches 4*e*2 and from a ground conductor surface 256*e* by gaps 244*e*.

Figure 14A:
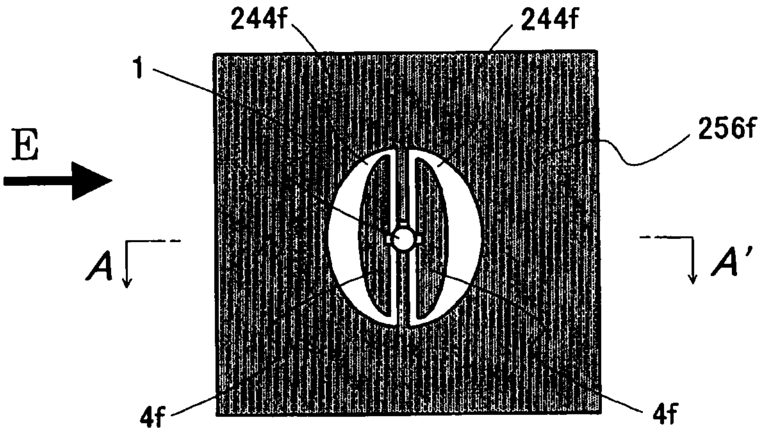
FIG. 14 is a set of schematic diagrams of an eighth configuration example of a resonant cavity applicable in the present invention.
Figure 14B:
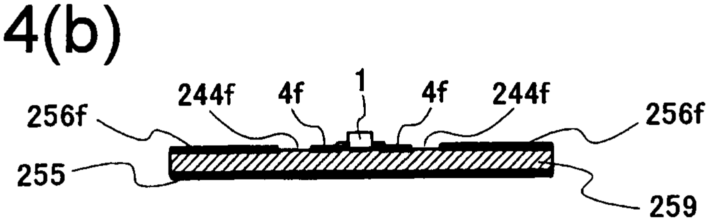

Shown in FIG. 14 is an eighth modification in which a resonant cavity for oscillation is configured by semi-elliptical conductor patches 4*f*, 4*f* and a ground conductor surface 256*f* arranged to maintain appropriate gaps 244*f* with respect to these conductor patches 4*f*, 4*f*. The width of the gaps 244*f* is varied with location to satisfy the oscillation condition.

The shapes of the conductor patches and gaps are not limited to the configuration examples shown in the aforesaid FIGS. 11~14 and any configuration can be applied in the present invention insofar as it satisfies the oscillation condition. Moreover, although the conductor patches, gaps, GND conductor surfaces and dielectric substrate constitute part of the feedback circuit for oscillating operation, provision of the dielectric substrate 259 and GND conductor surface 255 is not absolutely necessary insofar as the feedback can be suitably achieved. Note that the radiation when the GND conductor surface 255 is not present is in the direction of both surfaces of the conductor patches.

Figure 15A:
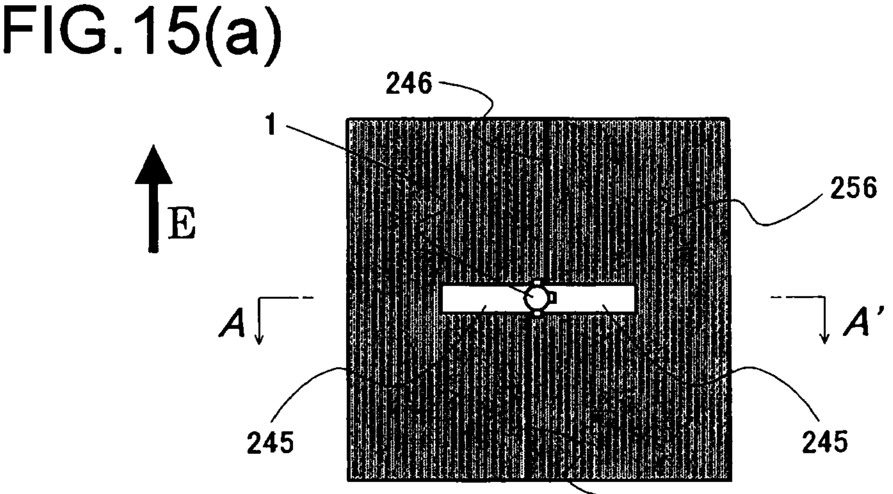
FIG. 15 is a set of schematic diagrams of a ninth configuration example of a resonant cavity applicable in the present invention.
Figure 15B:
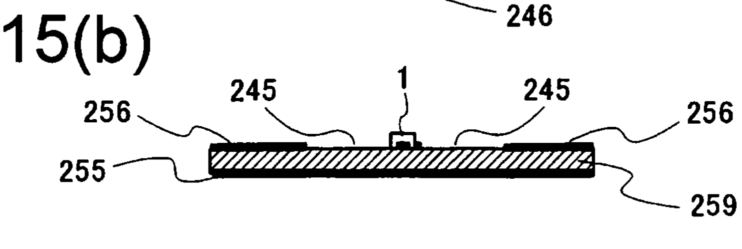

Shown in FIG. 15 is a ninth modification in which a resonant cavity for oscillation is configured by slots 245 and a ground conductor surface 256. The slots 245 are in a complementary relationship with the rectangular conductor patches 4*a* illustrated in FIG. 7 and satisfy the oscillation condition. The shape of the slots 245 is of course not particularly limited insofar as the oscillation condition is satisfied. In this configuration example, the gate and drain of the high-frequency transistor 1 are applied with different DC bias voltages, so that the gate and drain are separated direct-current-wise, and capacitive coupling sections 246 are provided for high-frequency conduction. The capacitive coupling sections 246 can be implemented using gap capacitance, MIM (Metal Insulator Metal) capacitance, capacitor parts or the like, and provision of the dielectric substrate 259 and GND conductor surface 255 is not absolutely necessary. Note that the radiation when the GND conductor surface 255 is not present is in the direction of both surfaces of the conductor patches.

Although the aforesaid modifications of the conductor patches are all examples in which a pair of conductor patches are provided symmetrically with respect to the high-frequency transistor 1, use of asymmetrically shaped conductor patches is also possible.

Figure 16A:
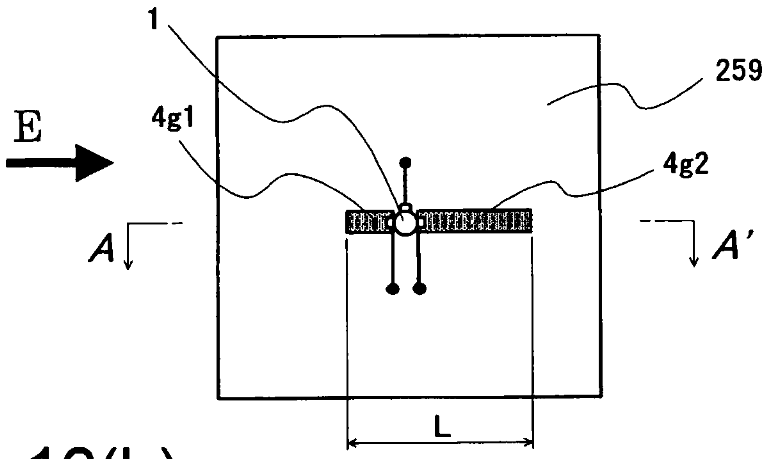
FIG. 16 is a set of schematic diagrams of a tenth configuration example of a resonant cavity applicable in the present invention.
Figure 16B:
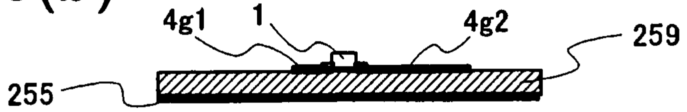

Shown in FIG. 16 is a tenth modification in which a rectangular first conductor patch 4*g*1 and a rectangular second conductor patch 4*g*2 are asymmetrically configured. Even if the first conductor patch 4*g*1 and second conductor patch 4*g*2 are made asymmetrical in this manner, operation as a radiation type oscillator of the type with the antenna and oscillating circuit forming a harmonious whole can be performed insofar as the oscillation condition is satisfied, because the resonant frequency is fundamentally determined by the size of the whole patch section (indicated as L in FIG. 16(*a*)).

Figure 17A:
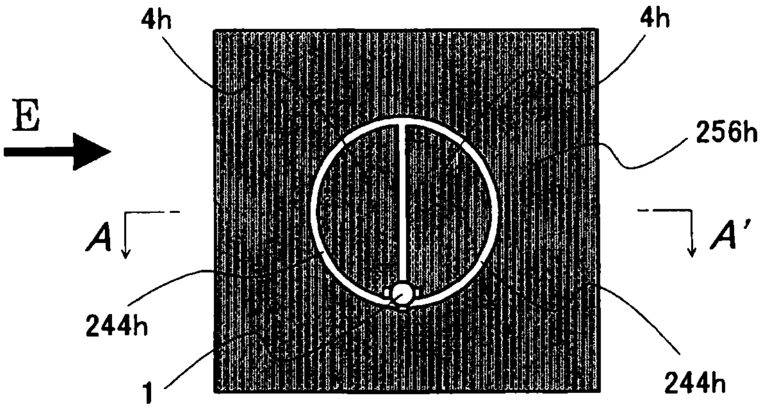
FIG. 17 is a set of schematic diagrams of an eleventh configuration example of a resonant cavity applicable in the present invention.
Figure 17B:
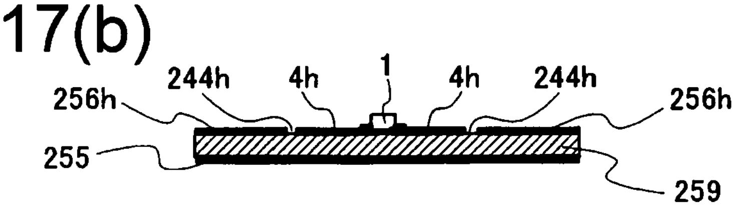

Shown in FIG. 17 is an eleventh modification in which a resonant cavity for oscillation is configured by using approximately semicircular conductor patches 4*h*, 4*h* and a ground conductor surface 256*h* arranged to maintain appropriate gaps 244*h* with respect to the conductor patches 4*h*, 4*h* to form a ring slot antenna on the radiation side.

Figure 18A:
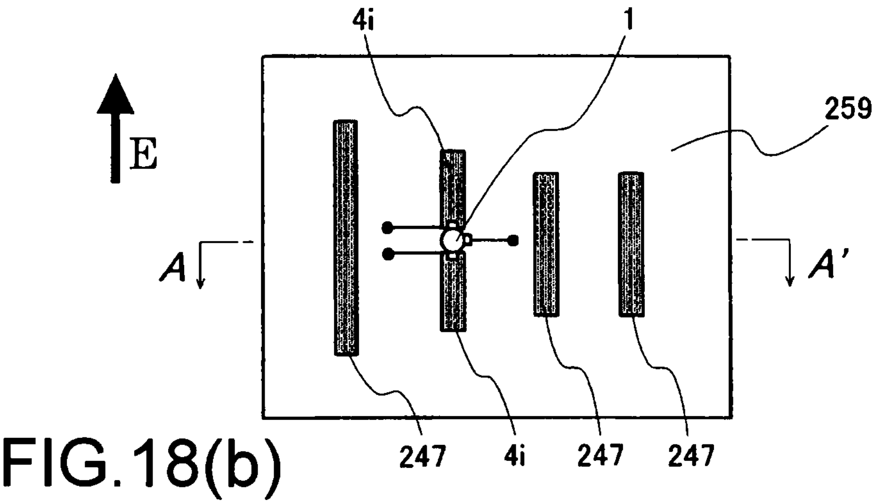
FIG. 18 is a set of schematic diagrams of a twelfth configuration example of a resonant cavity applicable in the present invention.
Figure 18B:
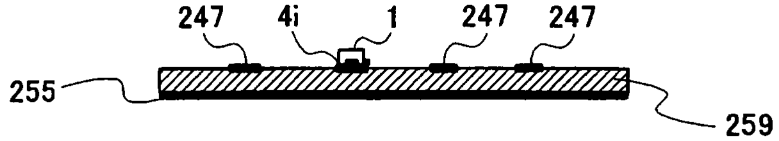

Shown in FIG. 18 is a twelfth modification that enables radiation directivity control by appropriately arranging conductor patches 247 not connected to the high-frequency transistor 1 around rectangular conductor patches 4, 4. Operation in the manner of, for example, a Yagi antenna can be achieved by appropriately defining the positional relationship and size relationship between the conductor patches 4*i*, 4*i* and conductor patches 247.

Figure 19:
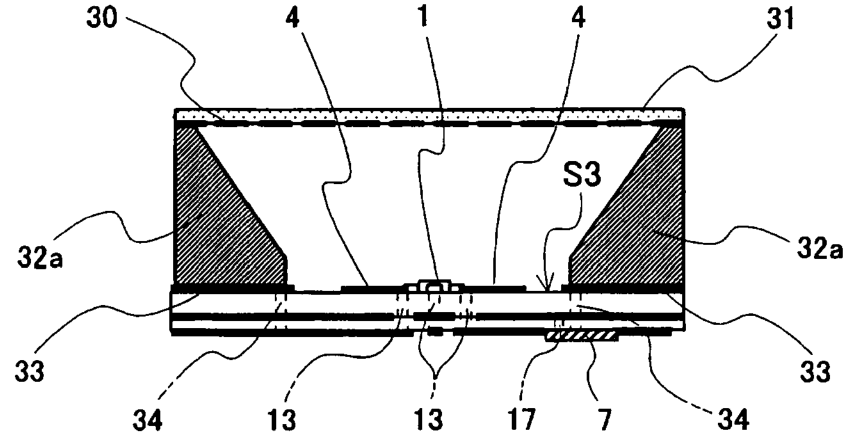
FIG. 19 is a schematic configuration diagram of a pulse signal generating device according to a third embodiment of the present invention.

Next, the pulse signal generating device according to a third embodiment will be explained based on FIG. 19. The pulse signal generating device of the present embodiment is provided on a radiation type oscillator substrate S3 (whose high-frequency pulse generating and radiating structure is the same as the radiation type oscillator substrate S1, S1', S2 or S2' set out in the foregoing and whose operation is also the same) with a Frequency Selective Surface (FSS) as a frequency selective filter means. Further, a grounding conductor structure is provided for preventing leakage of unnecessary signal components of a frequency lower than the frequency of the radiated high-frequency pulse signal (e.g., a base band signal component or monopulse signal component).

On the radiation direction side of the radiation type oscillator substrate S3 is arranged an FSS substrate 31 patterned on the side of the inner surface (surface facing the radiation surface of the radiation type oscillator substrate S3) with a low-pass filter pattern 30 and supported an appropriate distance apart from the radiation surface by a metal conductor structure 32*a* constituting a grounding conductor structure. The radiation type oscillator substrate S3 is provided with a grounding conductor solid pattern 33 surrounding the periphery of the conductor patches 4 as in the fifth modification shown in FIG. 11 and this grounding conductor solid pattern 33 is connected to an inner layer GND via through-holes 34. Note that many through-holes 34 are arranged around the conductor patches at intervals adequately shorter than the wavelength.

The metal conductor structure 32*a* is in electrical contact with the inner layer GND through the grounding conductor solid pattern 33, and the metal conductor structure 32*a* functions as a frame ground of the present device (universal ground conductor of the whole device) with respect to direct current and relatively low frequencies. Moreover, the radiation directivity of the high-frequency pulse signal is sharpened by forming the metal conductor structure 32*a* with a horn-shaped radiation cavity whose diameter expands from the radiation surface side of the radiation type oscillator substrate S3 toward the FSS substrate 31. In other words, the metal conductor structure 32*a* plays both the function of sharpening radiation directionality and the function of a frame ground.

Thus in the high-frequency pulse signal generating device of the present embodiment equipped with the FSS substrate 31 and the metal conductor structure 32*a*, the unnecessary harmonic frequency components of the generated high-frequency pulse signal can be attenuated in the FSS substrate 31 formed in the low-pass filter pattern 30. In addition, the electromagnetic field of the base band signal and monopulse signal components (from direct current to relatively low frequency components) that tend to leak from the conductor patches 4 are trapped between the conductor patches 4 and the frame ground and do not come to be radiated. Note that when the base band signal and monopulse signal frequency components are adequately low relative to the high-frequency pulse signal frequency component, leakage prevention function is present even if the metal conductor structure 32*a* is removed and the frame ground is formed of only the grounding conductor solid pattern 33 and the inner layer GND.

Further, the high-frequency pulse signal generating device of the present embodiment enables the RF circuit section to be isolated from the outside air because the high-frequency transistor 1 and conductor patch 4, 4 portion is in a state enclosed by the FSS substrate 31, the metal conductor structure 32*a* and the radiation type oscillator substrate S3. Therefore, degradation of performance by the external environment can be prevented by the FSS substrate 31, the metal conductor structure 32*a* and the radiation type oscillator substrate S3 serving as part of an air-tight housing of the present device.

Figure 20:
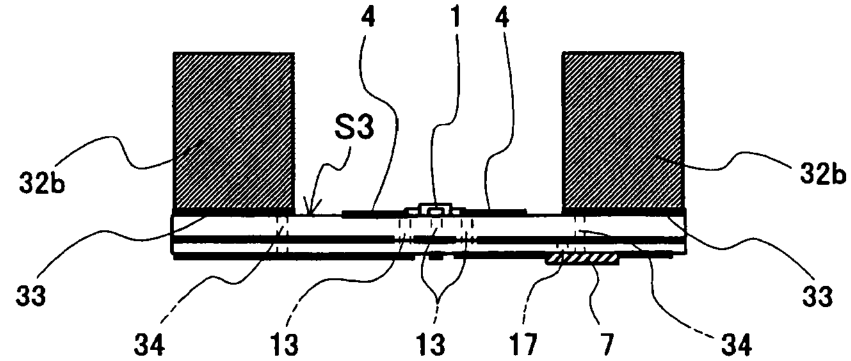
FIG. 20 is a schematic configuration diagram of a pulse signal generating device according to a fourth embodiment of the present invention.
Figure 21:
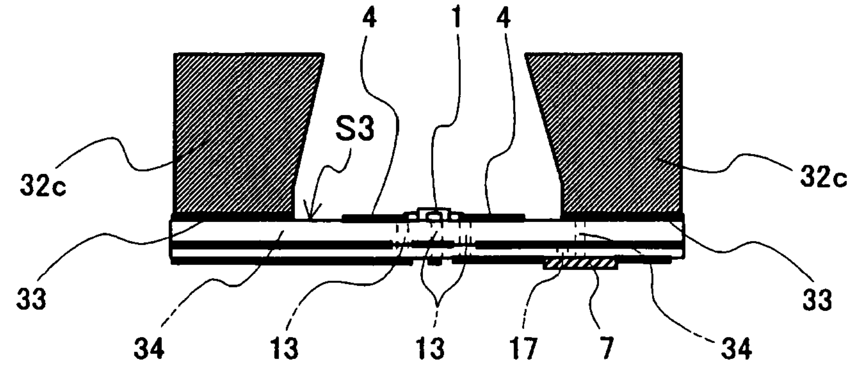
FIG. 21 is a schematic configuration diagram of a pulse signal generating device according to a fifth embodiment of the present invention.

Further, unnecessary leakage of the base band signal and monopulse signal can be prevented by not adopting the horn configuration of expanding the diameter of the radiation cavity in the radiation direction as in the metal conductor structure 32*a* but, as seen in the metal conductor structure 32*b* shown in FIG. 20, giving it a straight tubular shape (fourth embodiment) or as seen in the metal conductor structure 32*c* shown in FIG. 21, giving it a shape that contracts in diameter in the radiation direction (fifth embodiment), and defining the size of its aperture so as to cut off the base band signal and monopulse signal frequency components. Defining the size of the aperture to achieve cutoff is to make it smaller than what is called the cutoff frequency in a waveguide (lower cutoff frequency), and the cutoff frequency is the borderline frequency where the electromagnetic wave can no longer advance in the axial direction of the guide. Such a low-cut filter is simple in structure, while also providing the function of a band-pass filter means and an unnecessary signal leakage prevention means utilizing a grounding conductor structure.

Further, it is also possible to selectively pass and radiate a desired harmonic frequency component by appropriately defining the circuit pattern in the FSS substrate 31 and attenuating the fundamental wave frequency of the generated high-frequency pulse signal. By positively utilizing the harmonic frequency component in this manner, without allowing it to become an unnecessary signal, a device capable of relatively high frequency pulse signal radiation can be realized even by using a low-cost, low-performance transistor of small fmax (maximum oscillation frequency). Note that in a high-frequency pulse signal generating device using a harmonic frequency component, the radiated power becomes weak compared with the case of using the fundamental wave frequency component but use as a signal source for close-range communication or a close-range sensor is possible.

Note that while the FSS used as a band-pass filter means in the present embodiment is realized by patterning the FSS substrate 31 with an FSS pattern surface, the substrate is not particularly necessary insofar as the FSS pattern surface can be retained.

Figure 22:
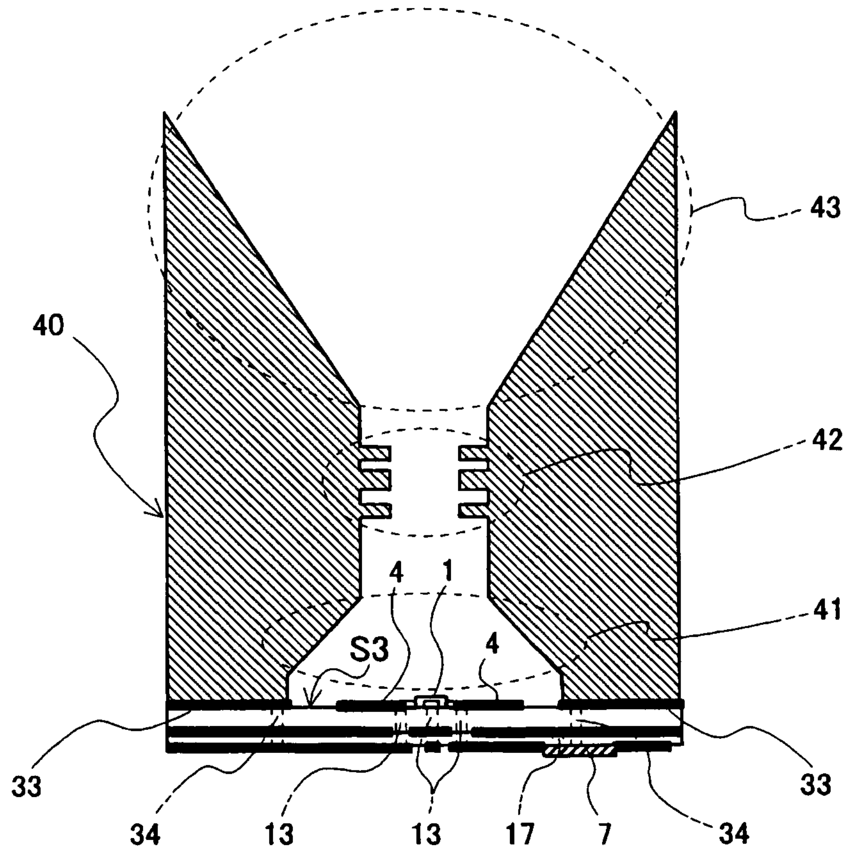
FIG. 22 is a schematic configuration diagram of a pulse signal generating device according to a sixth embodiment of the present invention.

Further, the pulse signal generating device of a sixth embodiment adopting a band-pass filter means other than an FSS is provided with a waveguide filter 40 as in FIG. 22.

The waveguide filter 40 is provided with a converter 41 for converting the radiation wave of the radiation type oscillator to a waveguide transmission wave, a filter 42 comprising an iris substrate and other wave guide circuitry, and a horn antenna 43 for radiating a passed signal of a desired RF band selected and passed or attenuated by the filter 42. Note that the converter 41 is one obtained, for example, by a tapered structure that progressively varies the guide thickness to the desired size of the waveguide aperture, and if the conductor patches 4 of the radiation type oscillator substrate S3 should be of smaller size than the desired size of the waveguide aperture, the tapered structure is unnecessary and the structure suffices insofar as the radiation wave from the radiation type oscillator substrate S3 can be efficiently converted to the transmission wave of the waveguide.

Although explanation was made based on a number of embodiments of the pulse signal generating device according to the present invention, the present invention is not limited to only these embodiments and all pulse signal generating devices realizable without modifying the configurations set out in the claims for patent are subsumed within the scope of the right.

The aforesaid advantages of the pulse signal generating device of the present invention exhibiting the characteristic effects set out in the foregoing can be exploited by use in, for example, a UWB communication system, a UWB in-car sensor (radar) system, a UWB radio wave monitoring system for crime-prevention, medical care, nursing or the like, or a UWB active imaging array. It can be expected to offer especially great advantages in milliwave band systems that are high in part cost, and low in power efficiency owing to increased transmission loss or device performance. Note that in application to these systems, operation of the pulse signal generating device of the present invention also as a Self-Oscillating downconverter mixer makes it possible to realize an impulse UWB transmitter, a UWB receiver, and a UWB sensor device in the same device. For example, if, as a transmitter, a high-frequency pulse signal train is generated and radiated at desired timing using a desired baseband signal, and, as a receiver, a high-frequency pulse signal corresponding to a local signal is generated when a high-frequency pulse signal arriving from the outside enters the present device, it is possible to realize a UWB transmitter-receiver and UWB sensor device of good signal-to-noise ratio that downconvert (Mixing operation within the pulse width time) only when the timing coincides. Conceivable ways to sharpen the radiation directivity include the method of establishing a desired aperture by providing a horn structure on the radiation direction side of the present device and the method of installing a dielectric lens for controlling the wave front near the radiation Patch or Slot on the radiation direction side.

The aforesaid UWB communication system is a system in which an impulse UWB transmitter-receiver comprising the pulse signal generating device according to the present invention is incorporated in a PC, peripheral device, AV equipment, mobile terminal or the like in a home or office environment and data communication is conducted among the different equipment. This system can achieve cableless connection between equipment at lower cost than a system using a conventional UWB transmitter-receiver. Moreover, owing to the low power consumption, it is particularly advantageous when incorporated into a battery-operated notebook PC other such mobile equipment.

The aforesaid in-car sensor system is a system in which multiple UWB sensor devices comprising pulse signal generating devices according to the present invention are mounted on all sides of the car body, each is suitably modulation-operated, and the phase information, delay time and the like of an IF signal obtained from a desired device among the multiple UWB sensor devices comprised by the multiple pulse signal generating devices are comprehensively signal processed and signal analyzed to perform automatic control, alert the operator, etc. As compared with the case of using a single sensor, this enables accurate multilateral sensing and high-resolution sensing, and further makes it possible to determine the direction of a target electrically at high speed, without need to swing the sensor direction mechanically with a motor or the like. Of particular note is that the UWB sensor device comprising the pulse signal generating device according to the present invention can be provided at low cost and low power consumption, so that an in-car system having, inter alia, safe driving features such as sophisticated collision prevention utilizing many sensor devices, a parking assistance feature, and a feature for prevention of accidents owing to blind spots around the vehicle, can be realized in an affordable price range.

The aforesaid UWB radio wave monitoring system for crime-prevention, medical care, nursing or the like is, for example, a system in which UWB sensor devices comprising pulse signal generating devices according to the present invention are installed at many locations around a residence and warnings are given regarding information from the IF signals obtained from the sensor devices at the individual locations, such as the presence, location and movements of a suspicious intruder, or a network is set up by installing a UWB sensor device on the ceiling above each of many patient beds in a hospital and the presence, breathing or the like of each patient is monitored to warn of any abnormality. In building such a system using many sensor devices, it is important for the individual sensors devices to be low in cost and, therefore, the UWB sensor device comprising the pulse signal generating device of the present invention is advantageous. Of particular note is that the UWB sensor device comprising the pulse signal generating device according to the present invention has high sensitivity and therefore can be operated at reduced radiation power, and, moreover, that it is possible to realize low-cost supply as sensor devices using the sub-millimeter band and millimeter band radio waves whose impact on the operation of other electronic equipment is smaller than that of the sub-microwave band radio waves whose use has advanced in mobile telephones and the like, so that utility is especially high in hospitals where there is a need to eliminate the effects of extraneous radio waves that cause medical equipment, heart pacemakers and the like to malfunction.

The aforesaid active imaging array performs imaging of the shape, shape changes and the like of objects of detection by arranging an N-row, M-column matrix of radiation type oscillator s in a UWB sensor device comprising the pulse radar device according to the present invention to configure a radiation type oscillator substrate, operating/scanning desired radiation type oscillator s or all radiation type oscillator s by matrix control, and comprehensively signal processing and signal analyzing the IF signals acquired from the radiation type oscillator s.

The invention claimed is:

1. A pulse signal generating device comprising:

a radiation oscillator that includes a three-electrode high-frequency amplifying device integrated with a resonator, the radiation oscillator generates negative resistance for oscillation and simultaneously functions as a radiation antenna of said pulse signal generating device, wherein the three-electrode high-frequency amplifying device is operated to establish the negative resistance, and a high-frequency pulse signal of an oscillating frequency/frequency band width determined based on the negative resistance and a structure of a resonant cavity of the radiation oscillator is generated and simultaneously radiated into space.

2. The pulse signal generating device as set out in claim 1, wherein:

three electrodes of the three-electrode high-frequency amplifying device of the radiation oscillator are a controlled current inflow electrode, a controlled current outflow electrode and a control electrode; and a monopulse signal is supplied to the controlled current inflow electrode or the controlled current outflow electrode and a power of the monopulse signal is used as source power to establish the negative resistance.

3. The pulse signal generating device as set out in claim 1, wherein:

three electrodes of the three-electrode high-frequency amplifying device of the radiation oscillator are a controlled current inflow electrode, a controlled current outflow electrode and a control electrode; and direct current is supplied to the controlled current inflow electrode or the controlled current outflow electrode and a monopulse signal is supplied to the control electrode to cause controlled current to flow and establish the negative resistance.

4. The pulse signal generating device as set out in claim 2, further comprising a monopulse signal generation circuit that generates the monopulse signal and is integrated into the radiation oscillator.

5. The pulse signal generating device as set out in claim 3, further comprising a monopulse signal generation circuit that generates the monopulse signal and is integrated into the radiation oscillator.

6. The pulse signal generating device as set out in any of claim 1 to 4 or 5, further comprising a band-pass filter that selectively filters waves of required frequency and that is disposed a distance apart from a radiation surface of the radiation oscillator.

7. The pulse signal generating device as set out in any of claim 1 to 4 or 5, further comprising a grounding conductor structure provided on a radiation direction side of the radiation oscillator to prevent leakage of unnecessary signal components of a frequency lower than the oscillating frequency/frequency band width of the high-frequency pulse signal.

8. The pulse signal generating device as set out in claim 6, further comprising a grounding conductor structure provided on a radiation direction side of the radiation oscillator to prevent leakage of unnecessary signal components of a frequency lower than the oscillating frequency/frequency band width of the high-frequency pulse signal.

* * * * *

UNITED STATES PATENT AND TRADEMARK OFFICE

CERTIFICATE OF CORRECTION

PATENT NO. : 8,847,817 B2
APPLICATION NO. : 13/123135
DATED : September 30, 2014
INVENTOR(S) : Utagawa et al.

It is certified that error appears in the above-identified patent and that said Letters Patent is hereby corrected as shown below:

On the title page, Item [73], the Assignees' Information is incorrect. Item (73) should read:

--[73] Assignees: National Institute of Information and Communications Technology, Koganei-shi (JP); Communications Research Laboratory, Inc., Koganei-shi (JP)--

Signed and Sealed this
Twentieth Day of January, 2015

Michelle K. Lee

Michelle K. Lee
*Deputy Director of the United States Patent and Trademark Office*